United States Patent
Swartwout et al.

(10) Patent No.: US 11,152,227 B2
(45) Date of Patent: Oct. 19, 2021

(54) LIFT-OFF EMBEDDED MICRO AND NANOSTRUCTURES

(71) Applicant: Massachusetts Institute of Technology, Cambridge, MA (US)

(72) Inventors: Richard Swartwout, Hamden, CT (US); Farnaz Niroui, Ontario (CA); Vladimir Bulovic, Lexington, MA (US); Jeffrey H. Lang, Sudbury, MA (US); Joel Jean, Beavercreek, OH (US)

(73) Assignee: Massachusetts Institute of Technology, Cambridge, MA (US)

( * ) Notice: Subject to any disclaimer, the term of this patent is extended or adjusted under 35 U.S.C. 154(b) by 224 days.

(21) Appl. No.: 16/107,566

(22) Filed: Aug. 21, 2018

(65) Prior Publication Data
US 2019/0080932 A1    Mar. 14, 2019

Related U.S. Application Data

(63) Continuation of application No. PCT/US2017/059499, filed on Nov. 1, 2017.

(60) Provisional application No. 62/415,587, filed on Nov. 1, 2016.

(51) Int. Cl.

| | |
|---|---|
| *H01L 21/56* | (2006.01) |
| *H01L 21/02* | (2006.01) |
| *H01L 23/31* | (2006.01) |
| *H01L 23/10* | (2006.01) |
| *H01L 29/06* | (2006.01) |

(52) U.S. Cl.
CPC ........ *H01L 21/568* (2013.01); *H01L 21/0259* (2013.01); *H01L 21/56* (2013.01); *H01L 23/10* (2013.01); *H01L 23/31* (2013.01); *H01L 23/3121* (2013.01); *H01L 29/0669* (2013.01)

(58) Field of Classification Search
CPC ... H01L 21/568; H01L 21/0259; H01L 21/56; H01L 23/10; H01L 23/31; H01L 23/3121
See application file for complete search history.

(56) References Cited

U.S. PATENT DOCUMENTS

| | | | |
|---|---|---|---|
| 2010/0012180 | A1 | 1/2010 | Day et al. |
| 2012/0282761 | A1 | 11/2012 | Spurgeon et al. |
| 2013/0075734 | A1 | 3/2013 | Cain et al. |
| 2014/0305900 | A1 | 10/2014 | Rogers et al. |
| 2014/0361409 | A1 | 12/2014 | Rogers et al. |
| 2016/0218063 | A1* | 7/2016 | Tsai .................... H01L 23/3171 |

OTHER PUBLICATIONS

International Search Report and Written Opinion dated Jan. 26, 2018 in connection with International Application No. PTC/US2017/059499.

* cited by examiner

*Primary Examiner* — Sue A Purvis
*Assistant Examiner* — Scott Stowe
(74) *Attorney, Agent, or Firm* — Wolf, Greenfield & Sacks, P.C.

(57) ABSTRACT

A method includes encapsulating structures disposed on or over a surface of a substrate in an encapsulant. The method also includes separating the encapsulant from the substrate. An apparatus includes a composite film having structures embedded in an encapsulant. The composite film has a surface with a surface roughness of less than one nm. An apparatus includes an encapsulant film having a surface with indentations formed therein. The surface has a surface roughness apart from the indentations of less than one nm.

8 Claims, 9 Drawing Sheets

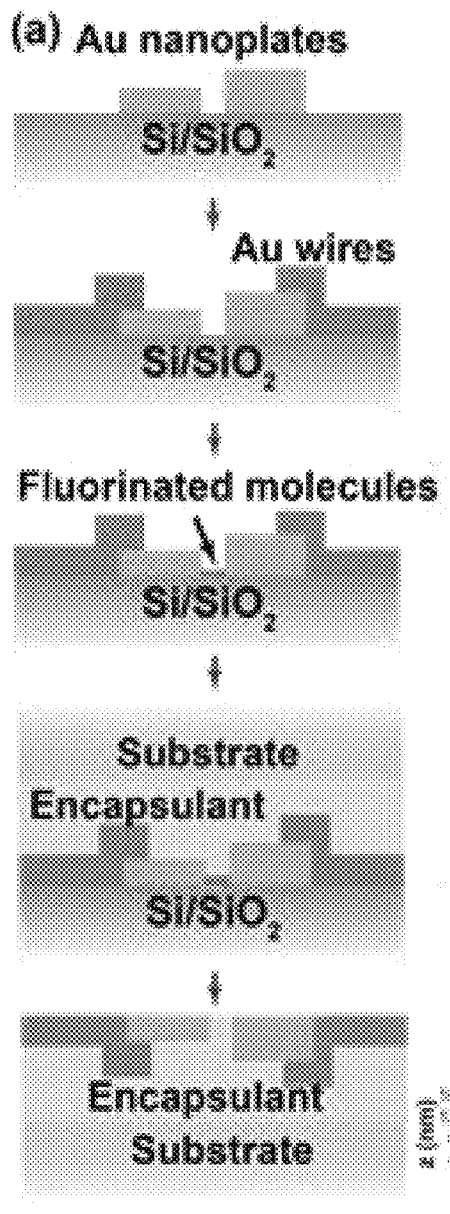
FIG. 3A
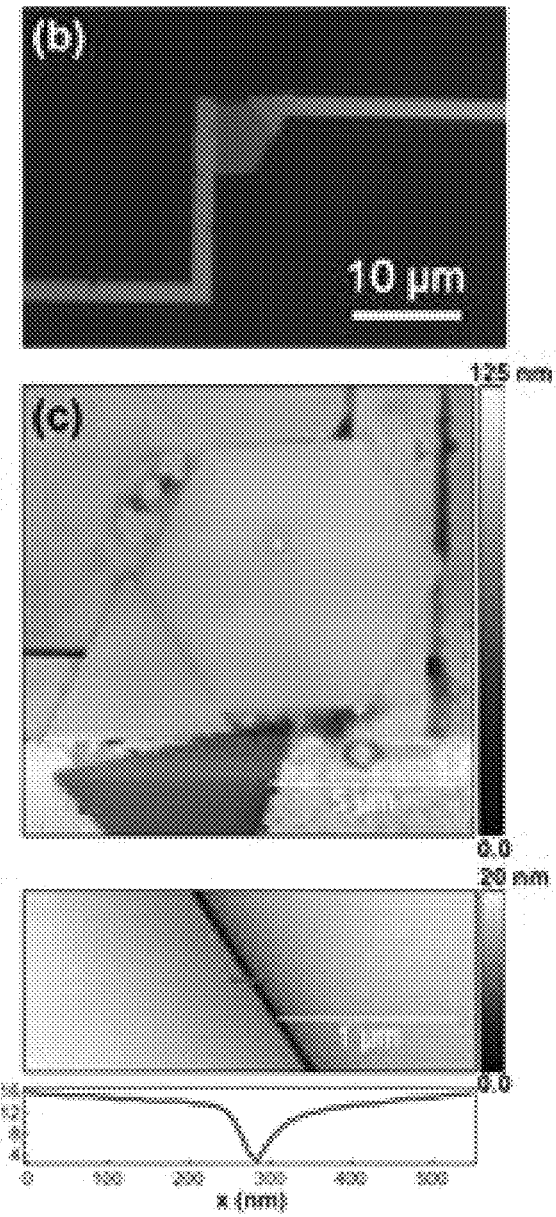
FIG. 3B
FIG. 3C

LIFT-OFF EMBEDDED MICRO AND NANOSTRUCTURES

RELATED APPLICATIONS

This application is a continuation of International Patent Application Serial No. PCT/US2017/059499, filed Nov. 1, 2017, entitled "LIFT-OFF EMBEDDED MICRO AND STRUCTURES", which claims the benefit of U.S. Provisional Application Ser. No. 62/415,587, filed Nov. 1, 2016, entitled "LIFT-OFF EMBEDDED MICRO AND NANO-STRUCTURES," each of which is hereby incorporated by reference in its entirety for all purposes.

FEDERALLY SPONSORED RESEARCH

This invention was made with Government support under Grant No. EECS0939514 awarded by the National Science Foundation. The Government has certain rights in the invention.

FIELD

The present invention relates generally to devices having nanoscale or microscale features and to methods of forming such devices.

BACKGROUND

Nanoscale and microscale structures have various applications in fields including electronics, optics, plasmonics, excitonics and mechanics.

SUMMARY

Some embodiments relate to a method that includes encapsulating structures disposed on or over a surface of a substrate in an encapsulant and separating the encapsulant from the substrate.

Encapsulating the structures may form a composite including the structures and the encapsulant.

Separating the encapsulant from the substrate may include separating the composite from the substrate.

At least one of the structures may be aligned with a surface of the composite.

Separating the encapsulant from the substrate may include peeling the encapsulant from the substrate.

Separating the encapsulant from the substrate may include etching the substrate.

The surface of the substrate may have a surface roughness of less than one nm.

The method may produce the encapsulant having a surface with a surface roughness of less than one nm.

The method may further include disposing the encapsulant on or over a secondary substrate.

The method may further include adhering the encapsulant to the secondary substrate either directly or through an intervining layer.

The method may further include disposing the structures on or over the substrate prior to the encapsulating of the structures.

The disposing of the structures may include growing or depositing the structures.

The method may further include forming at least one conductor contacting at least one of the structures prior to the encapsulating of the structures.

The conductor may be formed by lithography.

The encapsulating may include encapsulating both the structures and the at least one conductor.

At least one of the structures may be disposed above the substrate prior to the encapsulating.

At least one of the structures may be disposed on at least one standoff feature prior to the encapsulating.

The at least one standoff feature may include a sacrificial material.

The method may further include removing the sacrificial material after the separating of the encapsulant from the substrate.

The method may further include removing the sacrificial material after separating the encapsulant from the substrate.

The method may further include reducing a thickness of the encapsulant.

The encapsulant may be a first encapsulant and the method may further include encapsulating structures disposed on or over a surface of a substrate in a second encapsulant, separating the second encapsulant from the substrate, and joining the first encapsulant and the second encapsulant either directly or with an intervening layer between the first encapsulant and the second encapsulant.

The structures may be adhered to the surface of the substrate and remain on the surface of the substrate when the encapsulant is separated from the substrate.

The encapsulant may be imprinted by the structures.

The method may further include forming a conductive film over the substrate, wherein the at least one standoff feature is formed on the conductive film.

A height of the standoff feature may be selected to tune an optical property of a gap between the conductive film and the at least one of the structures.

The conductive film may include a metal film.

Some embodiments relate to an apparatus, including a composite film having structures embedded in an encapsulant, the composite film having a surface with a surface roughness of less than one nm.

At least one of the structures may be aligned with the surface.

At least one of the structures may be offset with respect to the surface.

At least one of the structures may be offset with respect to the surface by a distance of less than 100 nm.

At least one of the structures may be offset with respect to the surface by a distance of less than 10 nm.

The composite film may further include a conducive film disposed on the encapsulant.

The surface may be a surface of the conductive film.

The conductive film may be a metal film.

The apparatus may include at least one nanogap.

Some embodiments relate to an apparatus, including an encapsulant film having a surface with indentations formed therein, the surface having a surface roughness apart from the indentations of less than one nm.

The foregoing summary is provided by way of illustration and is not intended to be limiting.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention.

FIG. 3A illustrates forming an electrically active nanogap through a combination of bottom-up directed assembly to form the nanogap using gold nanoplates, and a top-down approach to develop the wires and contacts pads.

FIG. 3B and FIG. 3C show optical and AFM images, respectively, of a nanogap formed by the technique of FIG. 3A.

DETAILED DESCRIPTION

As discussed above, nanoscale and microscale structures have various applications in fields including electronics, optics, plasmonics, excitonics and mechanics, for example. However, the inventors have appreciated that manipulation of these structures and incorporation of them into functional systems faces a multitude of challenges. Disclosed herein is a technique by which structures can be embedded into an encapsulant and separated from a substrate to create smooth substrates for use in passive and active surfaces, devices and systems, for example. In some embodiments, using the techniques described herein, a structure-encapsulant composite may be produced having a surface that exhibits extremely low surface roughness, such as less than one nanometer, for example. The techniques described herein enable forming a structure-encapsulant composite (also termed herein a "composite") with a large area, with a surface exhibiting very low surface roughness over a large area. The structures may be embedded in the encapsulant and aligned with one another as well as the surface of the encapsulant. In some embodiments, the structures may be precisely offset from the surface of the encapsulant though the use of a material that can be deposited with precise thickness. The ability to produce encapsulated structures with surfaces having very low surface roughness and/or structures that are precisely offset with respect to a surface enables fabricating improved devices with microscale or nanoscale features, including but not limited to electrical, optical, mechanical, thermal, biological, chemical or plasmonic devices or molecular electronics, or devices having a combination of such properties.

Figure 1A:
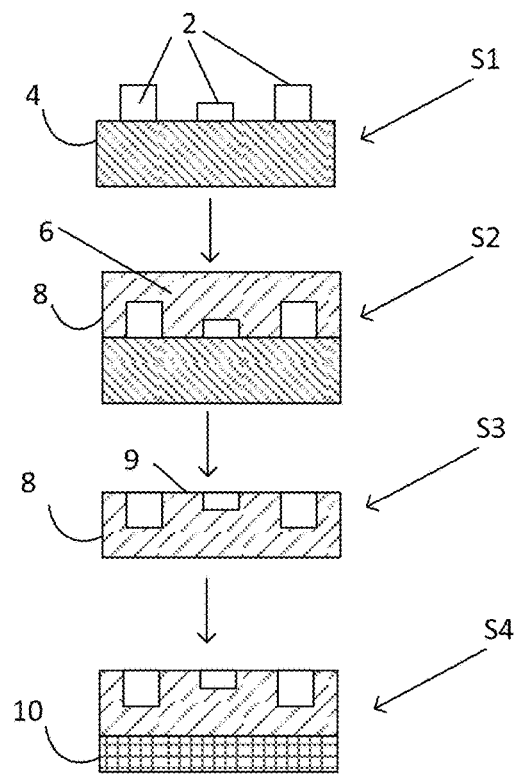
FIG. 1A shows a technique for forming a composite structure including embedded structures.

FIG. 1A shows a method of forming a composite structure including embedded structures, according to some embodiments. The technique illustrated in FIG. 1A and related techniques described herein are also referred to herein as "lift-off" techniques.

In step S1, structures 2 are deposited, grown, or otherwise disposed on the surface of a substrate 4. The substrate 4 may be planar, patterned or textured with any of a variety of optical, electrical and mechanical properties. In some embodiments, the substrate 4 may be a semiconductor substrate or a glass substrate. However, the substrate 4 is not limited to these examples, as any substrate with a suitably low surface roughness may be used. The structures 2 may be particles or patterned structures or a combination of these. The structures 2 may be nanostructures or microstructures. The structures 2 may have a length, a width and a height, with the length being the largest dimension (larger than the width or the height). The width and the height are cross-sectional dimensions. In some embodiments, the largest cross-sectional dimension of the structures 2 may be less than 1 mm, less than 1 micron, less than 100 nanometers (nm), or even smaller, such as less than 10 nm, but at least as large as one atom, such as larger than 0.1 nm. In some embodiments, the length may be less than 1 mm, less than 1 micron, less than 100 nanometers (nm), or even smaller, such as less than 10 nm, but at least as large as one atom, such as larger than 0.1 nm. The structures 2 may have any shape, including three dimensional shapes, approximately two-dimensional shapes, or approximately one-dimensional shapes (e.g., nanotubes, nanowires, or nanorods). The structures 2 may be formed through any suitable technique, including chemical synthesis and other top-down or bottom-up fabrication approaches, many examples of which are known in the art. The structures may be or may include nanoparticles, two-dimensional materials and/or patterned structures. One example of a technique for producing a patterned structure 2 is lithography. However, the techniques described herein are not limited in this respect, as other patterning techniques may be used. The structures 2 may be formed of any suitable material. The structures 2 may include or be composed of electrically conducting, semi-conducting, or insulating material(s). The structures 2 may include metallic, ceramic, organic, or polymeric materials, quantum dots or combinations of such materials, by way of example. The structures 2 may all have the same size and shape, or may have different sizes and/or shapes. The structures 2 may be transparent, semi-transparent or opaque to electromagnetic radiation of any frequency, or may have other suitable optical properties such as scattering properties. The structures 2 may be formed of the same material, or may be formed of different materials that exhibit different properties, such as different electrical, optical and/or mechanical properties, or other properties. For example, each of the structures shown in FIG. 1A may be formed of a different material and may exhibit different properties. However, the techniques described herein are not limited in this respect, as the structures may be formed of any number of different materials, and in any number of different sizes and/or shapes. The structures 2 may be any shape/material that can be formed through chemical synthesis and then positioned either random or through an aligned procedure on the substrates or formed through a fabrication technique including but not limited to lithography, molding, printing and transfer printing. It is possible to use combination of different types of structures, as well (particles that defer in materials, shape, size, or other inherent properties).

In step S2, the structures 2 are encapsulated by an encapsulant 6, thereby forming a composite 8 in which the structures 2 are embedded in the encapsulant 6. The encapsulant 6 may be formed of or include any suitable encapsulant material, such as a polymer, for example. The encapsulant 6 may be formed of a single material or a combination of materials in the form of a layered or mixed composite. In some embodiments, the encapsulant 6 serves as a passive structural component. In some embodiments, the material(s) encapsulant 6 may be selected to exhibit desired optical, mechanical, electrical or other physical properties independently or in conjunction with the structures 2. The encapsulant 6 may be electrically conducting, semiconducting or insulating. The encapsulant 6 may be transparent, semi-transparent or opaque to electromagnetic radiation of any frequency. In some embodiments, the material of encapsulant 6 may be exhibit low shrinkage and/or low intrinsic stress, which may be desirable for the encapsulant to have a smooth surface. The encapsulant 6 may be formed in any of a variety of suitable ways, such as chemical vapor deposition, spraying, spin casting, drop casting, etc. The techniques described herein are not limited as to the method of forming the encapsulant 6. In some embodiments, the resulting composite 8 may be a film including the encapsulant 6 having structures 2 embedded therein. In some embodiments, the composite 8 may have different material properties than the encapsulant 6 or structures 2 individually. For example, in the example with nanowires discussed below and illustrated in FIG. 2A, the nanowire/parylene composite has higher electrical conductivity than either the nanowires or the parylene alone.

In some embodiments, before forming the encapsulant the upper surface of the substrate 4 may be treated to make it easier to remove the composite 8 from the substrate 4 later. For example, a liquid, solid or self-assembled molecular layer may be deposited to reduce adhesion of the composite 8 to the substrate 4. In some embodiments the substrate and the encapsulant may be selected to be orthogonal materials (e.g., so they do not stick to each other). Another way to achieve this is by fluorinating the Si/SiO$_2$ or glass with fluorinated silane. Other examples would be to use polar and non-polar polymers for example, or using materials such as Teflon (PTFE) or FEP or PFA rather than glass/Si/SiO$_2$.

Figure 1B:
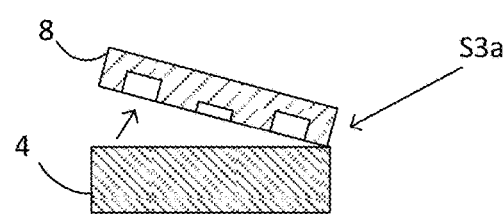
FIG. 1B illustrates an example of a separation step in which the composite 8 is peeled off the substrate.
Figure 1C:
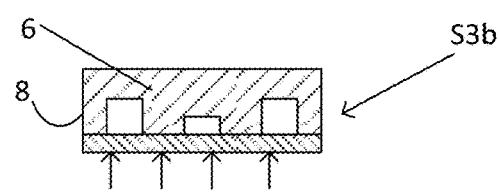
FIG. 1C illustrates another example of a separation step in which the substrate is etched away without significantly etching the composite.

In step S3, the composite 8 having the structures 2 embedded in the encapsulant 6 is separated from the substrate 4. The composite 8 may be separated from the substrate 4 using any of a variety of techniques. FIG. 1B illustrates an example of a separation step S3$a$ in which the composite 8 is peeled off the substrate 4. In such an example, an encapsulant material may be selected that is flexible and/or bendable. FIG. 1C illustrates another example of a separation step S3$b$ in which the substrate is etched away without significantly etching the composite 8. FIG. 1A shows the resulting composite 8 inverted in step S3 with respect to step S2. In some embodiments, the top surface 9 of composite 8 in FIG. 1 may have very low surface roughness, such as less than 2 nm, less than 1.5 nm, less than 1 nm, or less than 0.8 nm, but greater than 0.1 nm. The term "surface roughness" as used herein refers to root-mean-square (RMS) surface roughness, which may be measured by an atomic force microscope (AFM). Reference herein to a "surface" of composite 8 or encapsulant 6 having low surface roughness (e.g., less than one nm) may refer to surface 9. As illustrated in FIG. 1A, in this example the structures 2 have top surfaces that are aligned with one another and with the top surface of the encapsulant. In some embodiments, a film may be deposited or formed on the surface 9. For example, a conductive film such as a metal film may be deposited to contact one or more of structures 2. In some cases the film may be separated from the structures 2 by a gap, as discussed further below. Any number of active or passive layers may be formed on or over the surface 9. In some embodiments, the surface 9 has an area of at least one square micron, at least ten square microns, at least one hundred square microns, and may be much larger such as greater than one million square microns, or greater, such as up to a square meter or greater.

The composite 8 may be free-standing, allowing for ultra-thin substrates with embedded features. Alternatively, in an optional step S4, the composite 8 may be disposed on a secondary substrate 10. The secondary substrate 10 may be planar, patterned or textured with any of a variety of optical, electrical and mechanical properties. The secondary substrate 10 may be electrically conducing, semiconducting or insulating. The secondary substrate 10 may be transparent, semi-transparent or opaque to electromagnetic radiation of any frequency. Secondary substrate 10 may be flexible to allow for flexible electronics or other devices. In other embodiments, secondary substrate 10 may be rigid, and may provide mechanical support for the composite 8. The composite 8 may be adhered to the secondary substrate 10.

Figure 2A:
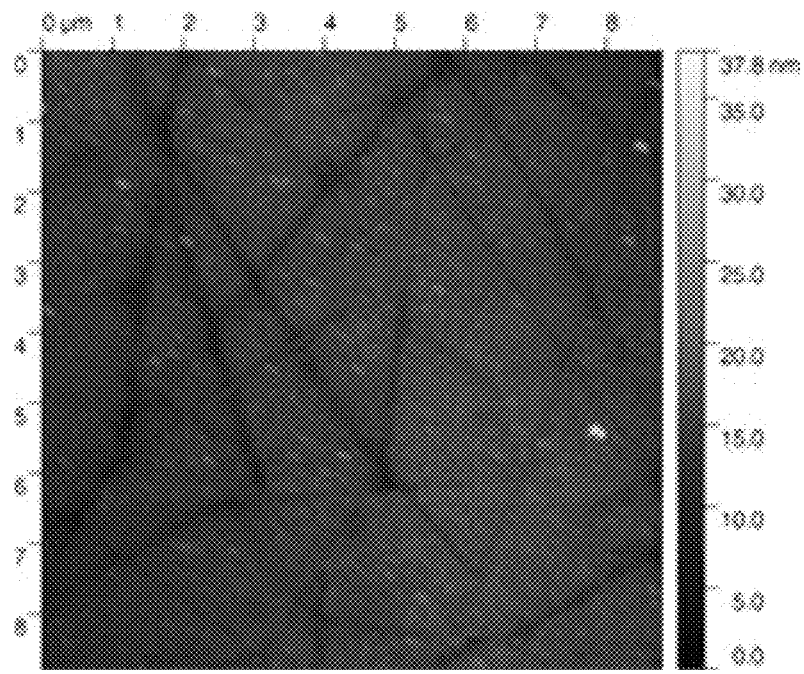
FIG. 2A shows an image of an example of a composite in which the structures are silver nanowires embedded into an encapsulant formed of parylene.
Figure 2B:
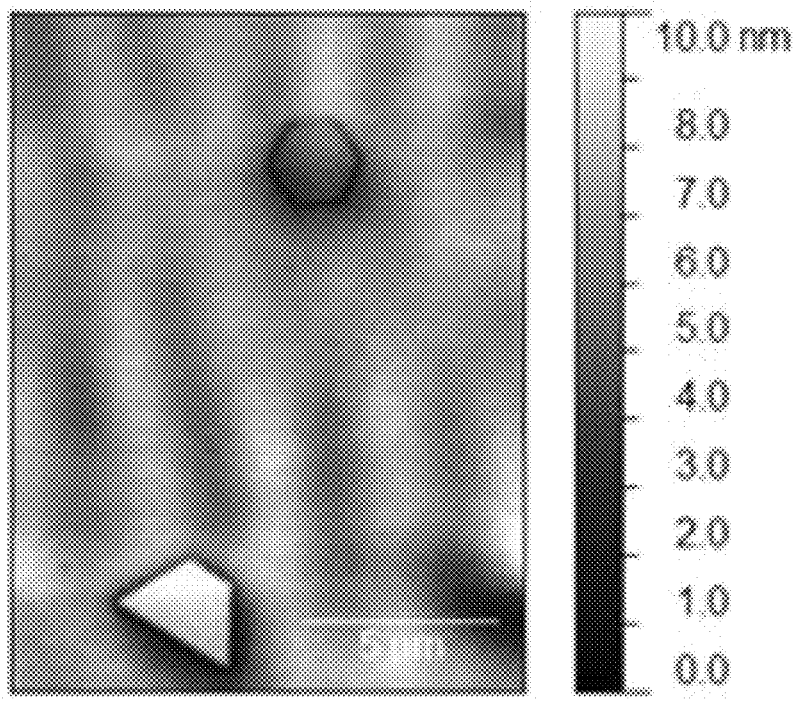
FIG. 2B shows an image of an example of a composite in which the structures are gold nanoplates embedded in an encapsulant formed of epoxy.

FIG. 2A shows an image of an example of a composite 8 in which the structures 2 are silver nanowires embedded into an encapsulant 6 formed of parylene. FIG. 2B shows an image of an example of a composite 8 in which the structures 2 are gold nanoplates embedded in an encapsulant 6 formed of epoxy. However, these are examples, and it should be appreciated that a wide variety of structures and encapsulants may be used.

In some embodiments, through a combination of top-down and bottom-up fabrication techniques chemically synthesized or fabricated micro/structures can be assembled and electrically probed to allow for electrically, optically, plasmonically and electromechanically active devices. Alternatively, active devices and circuits having of micro- or nanostructures can be formed through use of top-down fabrication alone. In such cases, surface roughness, non-uniformity in surface profile and edge defects can result in low yield of functional devices and a non-ideal device optical, electrical and mechanical performance. This is especially a challenge when working with nanoscale devices where nanometer surface deformations can drastically affect the device performance. A variation of the method of FIG. 1A can be utilized to overcome this challenge, achieving ultra-smooth and planarized surfaces while reducing or eliminating the edge roughness and defects obtained through the normal top-down fabrication techniques. Examples of this process are shown in FIGS. 3A-C and 4.

FIG. 3A illustrates forming an electrically active nanogap through a combination of bottom-up directed assembly to form the nanogap using gold nanoplates, and a top-down approach to develop the wires and contacts pads. As depicted here, the lift-off technique through which the devices are embedded into an encapsulant develops an ultra-smooth, planarized surface free of surface and edge roughness for use in various device architectures. Nanogaps are formed using gold (Au) nanoplates and a directed-assembly technique. To electrically probe the nanogaps, wires and contacts are added to the design using by lithography and by depositing a gold film. The nanogap may be treated with fluorinated molecules to modify the surface of the substrate to have an anti-stiction property to facilitate lift-off. To planarize the irregularities across the nanogap imposed by thickness variations in the plates and also to eliminate the roughness of wires and pads due to the lithography process, the lift-off technique of FIG. 1A may be used. Using an encapsulating film, the electrically probed gaps are inverted to access the side originally in contact with the substrate. Optical and AFM images of such a nanogap are shown in FIG. 3B and FIG. 3C, respectively. A uniform surface profile is observed across the gap. In the technique of FIG. 3A, different materials may be used, and different structures and devices may be formed. For example, gold may be replaced with any suitable conductor, such as another metal, or a semiconductor.

Figure 4:
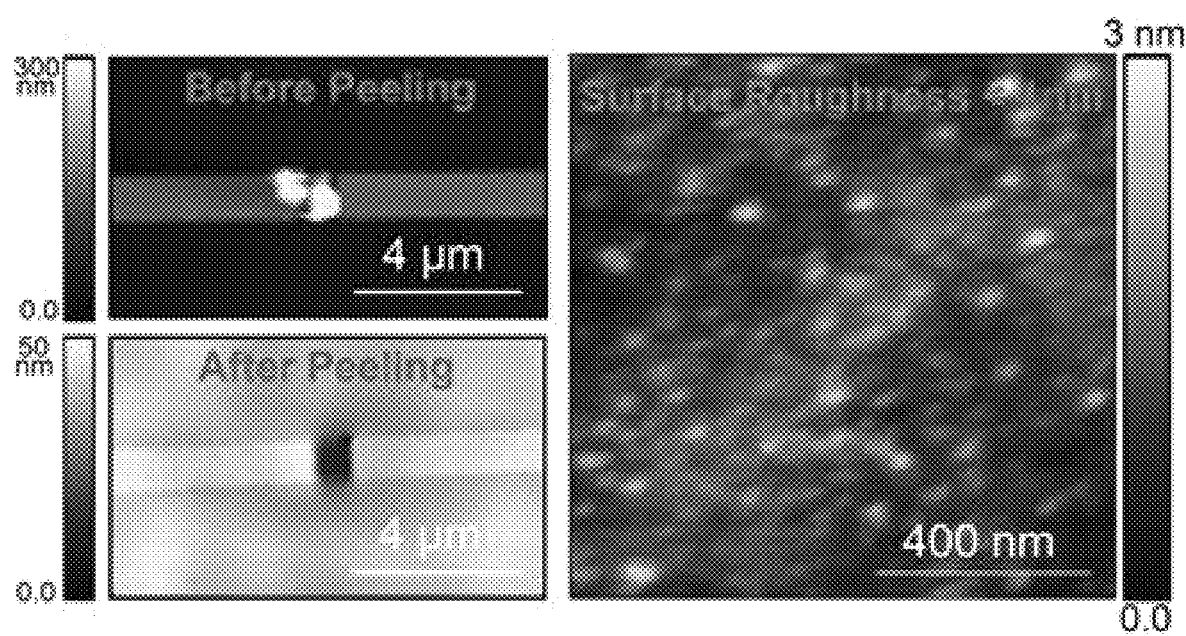
FIG. 4 shows images of structures produced in a technique similar to that of FIG. 3A but through a top-down lithography technique.

FIG. 4 shows the results of a similar process but for the case of electrically-accessible structures formed through a top-down lithography technique. The method of FIG. 1A helps eliminate the edge defects imposed by the lift-off process and achieve sub-nm surface roughness by making accessible for further processing the side of the gold film originally in contact with the flat substrate. Through sequential steps or by stacking three-dimensional features and systems can be formed. while maintaining nanometer precision and uniformity.

Figure 5A:
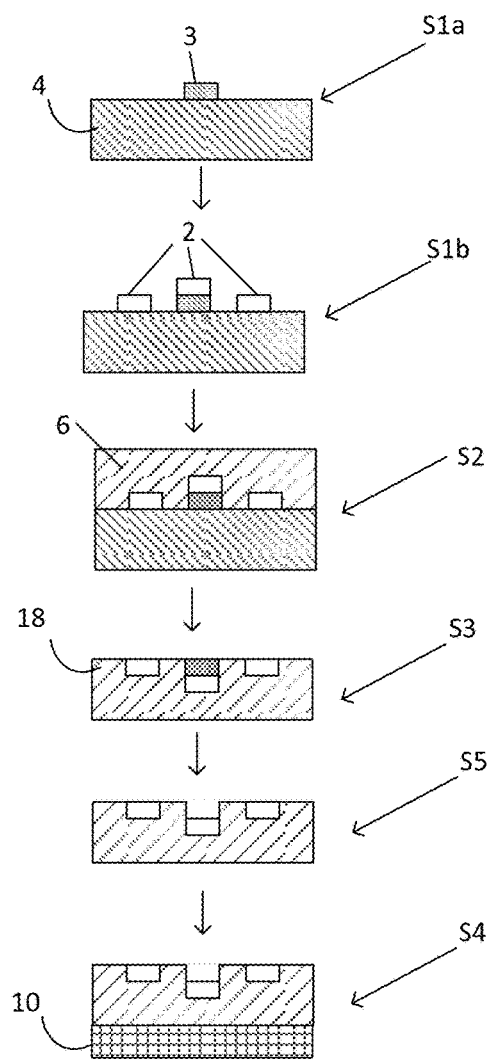
FIG. 5A illustrates a technique in which a structure is separated form a surface by a stand-off feature.

To develop active devices, in addition to ultra-smooth surfaces, controlled fabrication of neighboring features with height variations defined with nanometer resolution is highly desirable. In some embodiments, the shape and/or structure of surface features may be controlled. We have developed a variation of the lift-off technique to achieve nanometer-resolution in defining such surface topography. In this approach, well-defined standoff features may be used to define the desired height variations and/or shape. The standoff feature can be formed through use of materials such as exfoliated or chemically grown two-dimensional materials or nanometer-thin films formed through atomic layer deposition or other thin-film deposition techniques. In some embodiments the standoff material may be a sacrificial material. After lift-off these sacrificial features can be stripped off the surface of the devices such that well-defined height variations between neighboring structures are achieved. An example of such a process is shown in FIG. 5A.

Figure 5B:
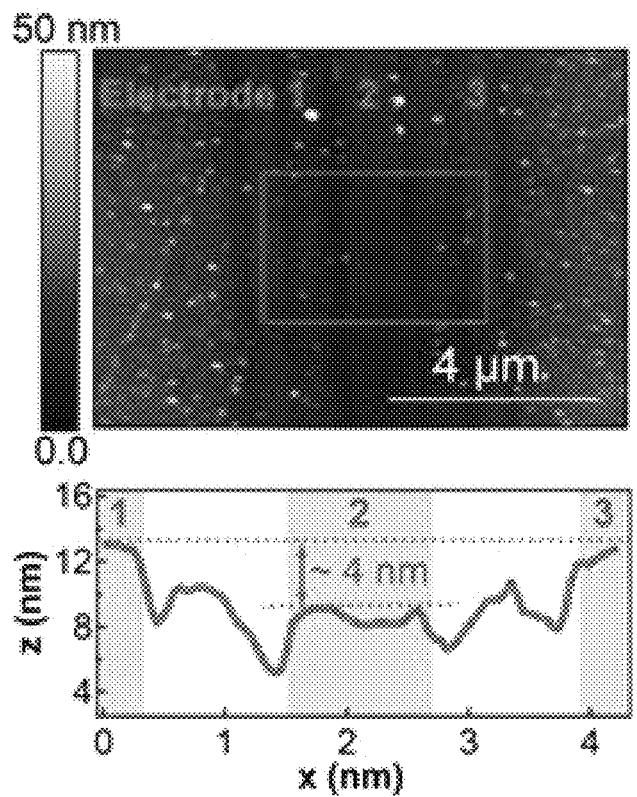
FIG. 5B illustrates the depth profile along the composite after removal of the standoff feature.

In step S1a, one or more standoff features 3 is/are deposited or grown on a substrate 4. A standoff feature 3 may be formed of one or more materials that can be deposited or grown in the vertical dimension with nanoscale tolerances. For example, in some embodiments the material of the standoff feature may be grown with a tolerance in the vertical dimension of less than one nanometer. Any suitable materials may be used. In some embodiments, a two-dimensional material may be used, which may be deposited in sheets with a sheet depth of one atom. One example of a two-dimensional material is graphene. In some embodiments, the standoff feature 3 need not necessarily be a two-dimensional material, and may be formed by atomic layer deposition (ALD). Examples of suitable materials that may be formed by ALD include aluminum oxide and silicon nitride. However, the material of the standoff feature 3 is not limited to these examples. FIG. S1b shows that after the standoff feature 3 is deposited or grown on the substrate 4 the structures 2 are grown or deposited on the substrate 4. One or more of the structures 2 may be disposed at least partially on top of a standoff feature 3, as illustrated in FIG. 5A. Accordingly, due to the standoff feature 3, the distance between a structure and the substrate 4 may be carefully controlled. In some embodiments, the distance may be less than 100 nm, such as less than 50 nm, less than 10 nm, or less than 5 nm. The encapsulation step S2 and separation step S3 may then be performed to form a separated composite 18, as discussed above. If the standoff feature 3 is sacrificial, it may be removed in step S5. The sacrificial standoff feature 3 may be removed using any suitable technique, such as etching, for example. In step S4, the composite material 18 optionally may be disposed on an secondary substrate 10. In an example device, the standoff feature 3 was formed of graphene, the distance between the central structure 2 and the substrate 4 was 5 nm, corresponding to the carefully controlled height of the standoff feature 3. The structures 2 were formed of gold and the substrate 4 was a silicon wafer coated with a layer of silicon dioxide. FIG. 5B illustrates the depth profile along the composite 8 after removal of the standoff feature 3. Depending on the desired device application and choice of material of the standoff feature 3, the removal step S5 need not be performed and the standoff feature 3 may remain as part of the device architecture. As an example, boron nitride can be used as the material of the standoff feature 3 and also may serve as an electrically insulating layer that remains in the device. However, the standoff feature 3 may have any of a variety of suitable functions and may be formed of any of a variety of materials.

Figure 5C:
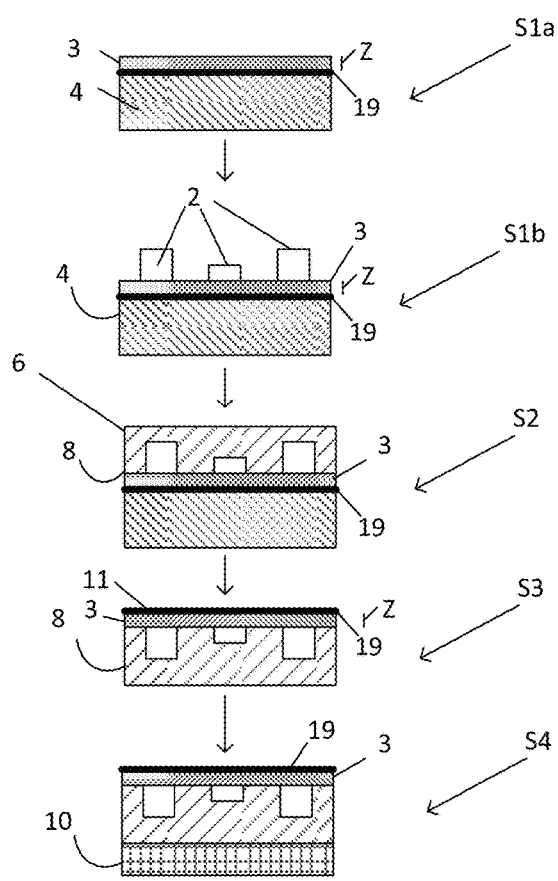
FIG. 5C shows another embodiment in which a standoff feature is used that remains in the final device.

FIG. 5C shows another embodiment in which a standoff feature 3 is used that remains in the final device. As discussed above, the standoff feature 3 may allow for precise control of positioning of features in the vertical dimension. FIG. 5C shows an embodiment in which the standoff feature 3 provides a precise separation Z between structures 2 and a layer 19 in the vertical dimension. Controlling the separation Z between features can enable tuning properties of a device, such as optical properties, for example.

FIG. 5C illustrates that in step S1a, a conducting or semiconducting film 19 may be deposited using any thin film deposition technique, grown or otherwise disposed on a substrate 4. The film 19 may be a metal film, in some embodiments. Alternatively or additionally, the film 19 may be formed of or include other materials such as graphene or a polymer, for example. Then, the standoff feature 3 is deposited, grown or otherwise disposed on the film 19. As discussed above, the standoff feature 3 may be a material with a thickness that can be precisely controlled. Examples of a suitable material include parylene and other dielectrics, which may be deposited by chemical vapor deposition. However, the material need not be deposited by chemical vapor deposition. In some embodiments it may be sputtered, deposited by atomic layer deposition (ALD) or evaporated. Another example of a suitable material for standoff feature 3 is graphene. In some embodiments, graphene may be liquid-transferred onto the underlying material. Another example is to spin coat a polymer or nanoparticles of monodisperse size. A further example is to use a self-assembled molecule. A self-assembled molecule may have active ends to anchor it. Self-assembled molecules may be chemically synthesized, and the thickness may be controlled to the sub-nanometer level. However, other materials may be used for the standoff feature 3. The standoff feature 3 may be the same material as that of the encapsulant 6, or a different material. The standoff feature 3 has a thickness Z in this example.

Then in step S1b, structures 2 are deposited, grown or otherwise disposed on the standoff feature 3. Any number of structures may be disposed on the standoff feature 3, with three structures being shown merely by way of illustration. The structures 2 may be patterned using a top-down approach. As an example, PMMA resist may be used for patterning with e-beam. Alternatively, an optically sensitive resist may be used for larger features. A continuous thin film may be deposited, the resist may be etched, and the non-exposed features may be removed. Another technique is to randomly deposit nanoparticles, which may be used in a case where x-y patterning is not needed. Another technique is to use a click-chemistry, such as DNA based patterning to orient particles in a specific manner from solution. A further technique is to use nano-imprinting or PDMS transfer patterning to "press" structures onto the standoff feature 3. However, any suitable technique may be used to form or deposit the structures 2.

Then, an encapsulation step S2 may be performed, as discussed above. Then the separation step S3 is performed to separate the film 19 and its overlying layers from the substrate 4. For example, the film 19 and overlying layers may be peeled off the substrate 4. Optionally, the resulting composite may be disposed on a secondary substrate 10. By using the technique of FIG. 5C, the distance Z between the structures 2 and the film 19 can be precisely controlled. Accordingly, the optical, mechanical, electrical or other properties of devices produced by this technique may be precisely controlled. The standoff feature 3 may enable producing plasmonic, plasmon-polariton or plexitonic gaps that can be precisely tuned. As an example, plasmonic particles (e.g., silver particles) may have dimensions in the range of 50-70 nm, and may be coupled to film 19 through a nanometer-scale gap.

Figure 5D:
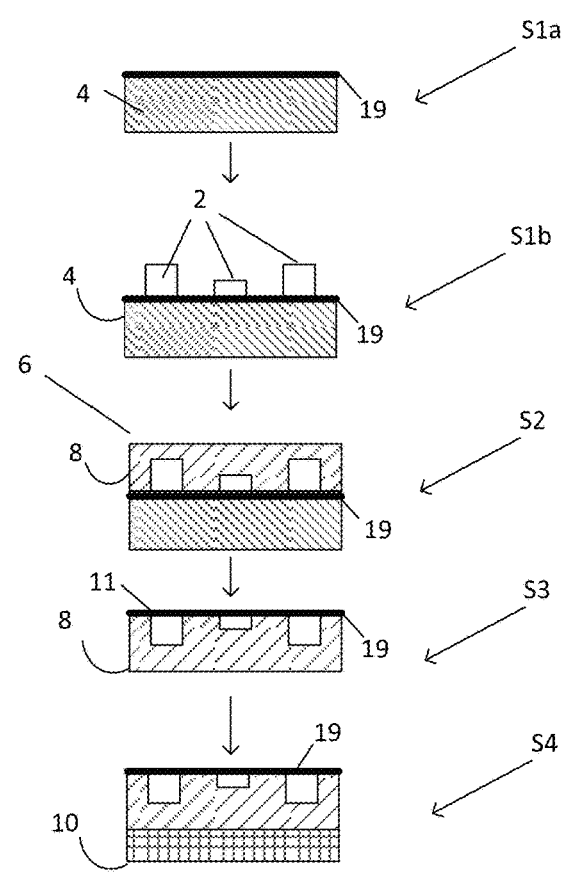
FIG. 5D shows an example of a technique similar to FIG. 5C in which the structures are disposed directly on a film (e.g., a conductive film).

The technique illustrated in FIG. 5C is not limited to a separation between the structures 2 and the film 19. In some embodiments, the structures 2 may be disposed directly on the film 19, such that the distance Z is zero. FIG. 5D shows an example of a technique similar to FIG. 5C in which the structures 2 are disposed directly on the film 19.

The techniques described herein can produce surfaces with very low surface roughness, providing an advantageous platform for the deposition or growth of additional materials above the surface. In this example, the film 19 may be formed to have a very low surface roughness (e.g., less than one nm), which provides a low surface roughness substrate for the formation of additional layers above film 19, in some embodiments.

Figure 6:
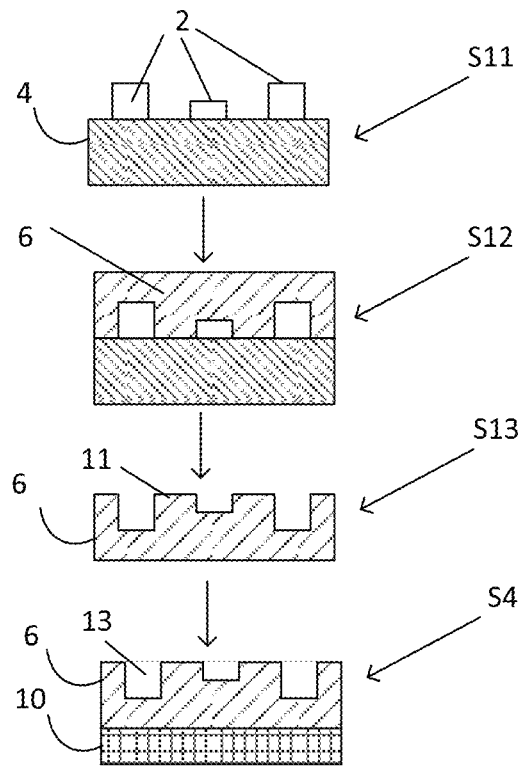
FIG. 6 illustrates a technique in which an encapsulant is imprinted by the structures and the structures remain in place on the substrate during the separation step.

As discussed above, it is possible to embed structures features into an encapsulant. In some embodiments, the structures may be used as a mold to imprint the surface of an encapsulant 6 with indentations, such as microscale or nanoscale indentations. The indentations may have the same sizes and/or shapes as the structures, as discussed above. In the example of FIG. 6, the structures 2 are affixed to the substrate 4 in step S11 such that they will remain in place on the substrate 4 during the separation step. The structures 2 and substrate 4 together form a mold. In step, S12, the structures are encapsulated by an encapsulant 6. In step S13, the encapsulant 6 is separated from the mold. This can be done similarly to the ways discussed above with respect to step S3 (e.g., peeling or etching, for example). This can produce an encapsulant 6 with an ultra-smooth surface that is imprinted by the shapes of the structures, resulting in indentations 13 in the encapsulant 6. Further materials may be disposed in the indentations 6 produced by the structures. Optionally, the encapsulant 6 may be disposed on a secondary substrate 10 in step S4.

Figure 7:
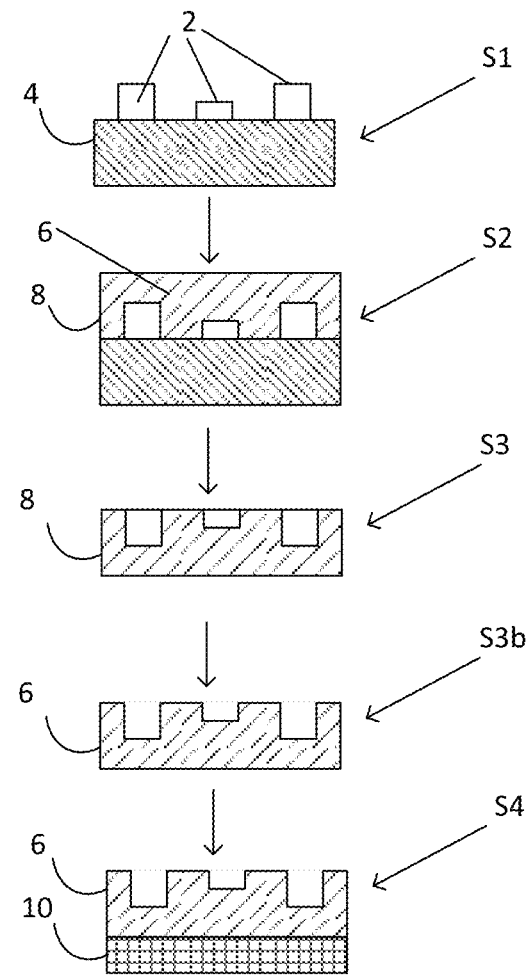
FIG. 7 shows another example of a technique that uses the structures as a mold to imprint the encapsulant.

FIG. 7 shows another example of a technique that uses the structures 2 as a mold to imprint the encapsulant. FIG. 7 is similar to the method of FIG. 1A, but rather than having the structures 2 remain in the composite 8 they are removed in step S3b. In some embodiments, the structures 2 may be formed of a sacrificial material that is removed (e.g., by etching) in step S3b.

Figure 8:
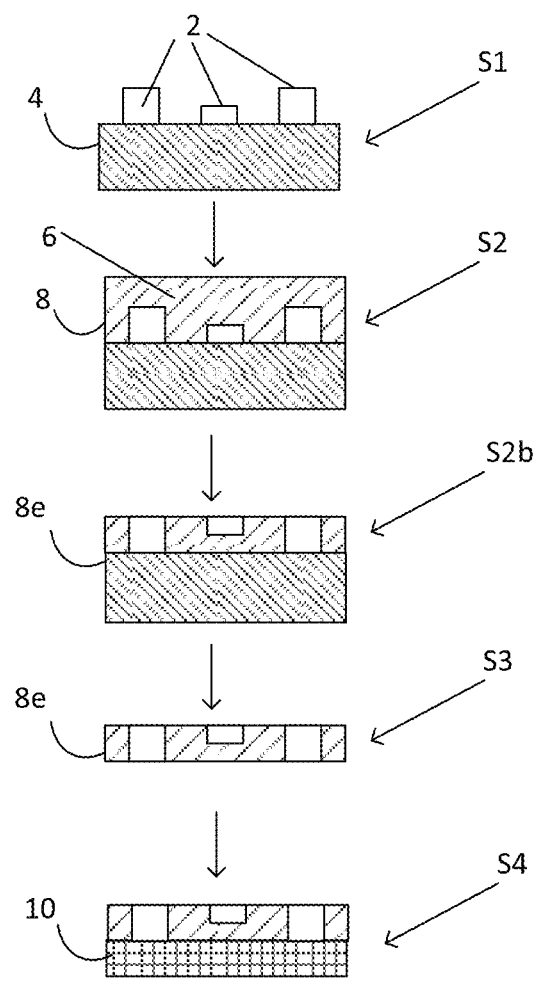
FIG. 8 illustrates that a portion of the encapsulant can be removed to reduce its thickness.

FIG. 8 illustrates that a portion of the encapsulant 6 or composite 8 can be removed to reduce its thickness. The thickness of the encapsulant may be reduced so that two sides of the structures 2 are exposed. The method of FIG. 8 is similar to the method of FIG. 1A, with the addition of an encapsulant thinning step S2b following the encapsulation step S2. The thinning of the encapsulant 6 or composite 8 may be performed by etching or another suitable technique. The resulting composite 8e optionally may be disposed on a secondary substrate 10.

Figures 9A, 9B:
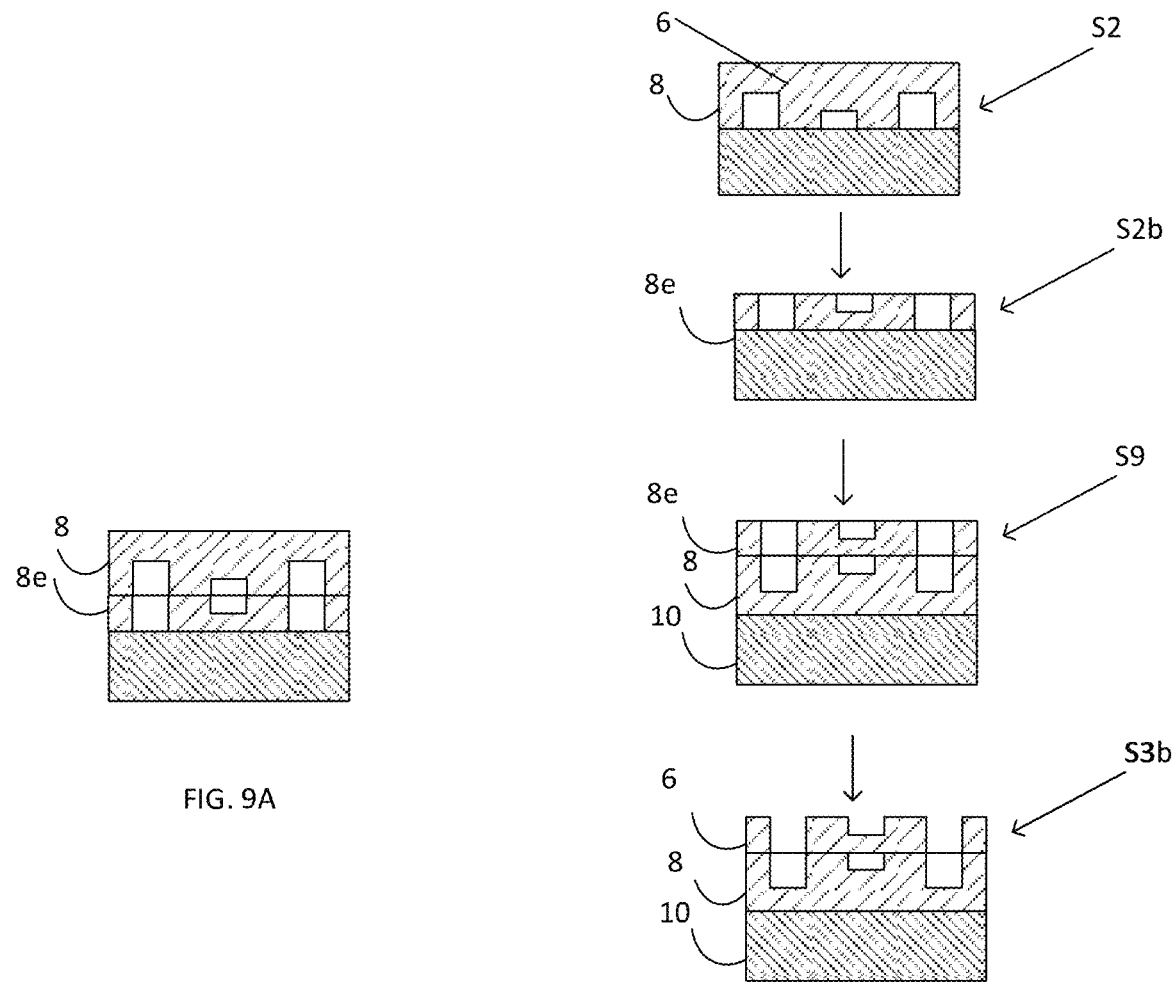
FIGS. 9A and B illustrate that a plurality of composites formed using any of the techniques described above may be joined together.

FIGS. 9A and B illustrate that a plurality of composites 8 or 8e formed using any of the techniques described above may be joined together. This may allow forming multiple layers of features for fabrication of multi-layer devices. Referring to FIG. 9A, the method of FIG. 1A may be performed to form a composite 8. The method of FIG. 8 may be performed to form an thinned composite 8e. The two composites 8 and 8e may then be joined, as shown in FIG. 9A. For example, they may be adhered to one another, either directly or with one or more intervening layers between them.

FIG. 9B illustrates another example in which a composite 8 is produced, then etched to produce a thinned composite 8e in step S2b. The thinned composite may be separated from the substrate 4 in step S3 (not shown), then the composite 8e may be joined to another composite 8, either directly or with one or more intervening layers between them, in step S9. Composite 8e may have structures 2 of a sacrificial material which are then removed in step S3b. It should be appreciated that more than two composites may be joined together, in some embodiments. Any of a variety of structures and devices may be produced by joining multiple layers of composites and/or encapsulants having smooth surfaces.

The techniques described herein allow for almost any structure to be embedded into a smooth or patterned substrate. This is useful for electrical, optical, and mechanical devices, plasmonics, electromechanical, molecular devices and biological systems (and any combination of systems) where surface roughness is of concern. In electronics, this allows for devices that are based on micro/nanofeatures to be used with traditional thin film deposition techniques. This technique is also useful for flexible electronics, optics, and a variety of other applications. In addition, this allows for traditionally rough surfaces to be smoothed out by being encapsulated, but still having a contactable surface(s). This can be highly important for device yield, lifetime and electric contacts. The encapsulant also allows for support of easily damageable micro/nanotechnologies which adds desirable mechanical rigidity. In addition, with the demonstrated technologies, parylene and epoxy are scalable technologies, with parylene being vapor deposited, so it does not disturb the underlying micro/structure. This is similar with epoxy due to its viscosity. However, in some embodiments an encapsulant may be that has a defined, non-zero shrinkage to pull particles or structures in closer than could typically be achieved by patterning, or self-release.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Any terms as used herein related to shape, orientation, alignment, and/or geometric relationship of or between, for example, one or more articles, structures, forces, fields, flows, directions/trajectories, and/or subcomponents thereof and/or combinations thereof and/or any other tangible or intangible elements not listed above amenable to characterization by such terms, unless otherwise defined or indicated, shall be understood to not require absolute conformance to a mathematical definition of such term, but, rather, shall be understood to indicate conformance to the mathematical definition of such term to the extent possible for the subject matter so characterized as would be understood by one skilled in the art most closely related to such subject matter. Examples of such terms related to shape, orientation, and/or geometric relationship include, but are not limited to terms descriptive of: shape—such as, round, square, circular/circle, rectangular/rectangle, triangular/triangle, cylindrical/cylinder, elliptical/ellipse, (n)polygonal/(n)polygon, etc.; angular orientation—such as perpendicular, orthogonal, parallel, vertical, horizontal, collinear, etc.; contour and/or trajectory—such as, plane/planar, coplanar, hemispherical, semi-hemispherical, line/linear, hyperbolic, parabolic, flat, curved, straight, arcuate, sinusoidal, tangent/tangential, etc.; direction—such as, north, south, east, west, etc.; surface and/or bulk material properties and/or spatial/temporal resolution and/or distribution—such as, smooth, reflective, transparent, clear, opaque, rigid, impermeable, uniform(ly), inert, non-wettable, insoluble, steady, invariant, constant, homogeneous, etc.; as well as many others that would be apparent to those skilled in the relevant arts. As one example, a fabricated article that would described herein as being "square" would not require such article to have faces or sides that are perfectly planar or linear and that intersect at angles of exactly 90 degrees (indeed, such an article can only exist as a mathematical abstraction), but rather, the shape of such article should be interpreted as approximating a "square," as defined mathematically, to an extent typically achievable and achieved for the recited fabrication technique as would be understood by those skilled in the art or as specifically described. As another example, two or more fabricated articles that would described herein as being "aligned" would not require such articles to have faces or sides that are perfectly aligned (indeed, such an article can only exist as a mathematical abstraction), but rather, the arrangement of such articles should be interpreted as approximating "aligned," as defined mathematically, to an extent typically achievable and achieved for the recited fabrication technique as would be understood by those skilled in the art or as specifically described.

What is claimed is:

1. An apparatus, comprising:
   a composite film having structures embedded in an encapsulant, the composite film having a surface with a surface roughness of less than one nm,
   wherein a largest dimension of the structures is less than one mm, and
   wherein the surface is a surface of the encapsulant and the structures are aligned with a plane of the surface of the encapsulant.

2. The apparatus of claim 1, wherein the composite film has at least one second structure embedded in the encapsulant and the at least one second structure is offset with respect to the surface.

3. The apparatus of claim 1, wherein the composite film has at least one second structure embedded in the encapsulant and the at least one second structure is one of the structures is offset with respect to the surface by a distance of less than 100 nm.

4. The apparatus of claim 3, wherein the distance is less than 10 nm.

5. The apparatus of claim 1, wherein the composite film further comprises a conductive film disposed on the surface.

6. The apparatus of claim 5, wherein the conductive film is a metal film.

7. The apparatus of claim 1, wherein the apparatus comprises at least one nanogap.

8. The apparatus of claim 1, wherein the surface has a surface roughness of less than 0.8 nm.

* * * * *

UNITED STATES PATENT AND TRADEMARK OFFICE
CERTIFICATE OF CORRECTION

PATENT NO.           : 11,152,227 B2               Page 1 of 1
APPLICATION NO.      : 16/107566
DATED                : October 19, 2021
INVENTOR(S)          : Richard Swartwout et al.

It is certified that error appears in the above-identified patent and that said Letters Patent is hereby corrected as shown below:

In the Claims
At Column 14, Claim 3, Lines 13-14, the words "one of the structures is" are hereby deleted Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*